United States Patent [19]

Hunsinger et al.

[11] Patent Number: 4,633,285
[45] Date of Patent: Dec. 30, 1986

[54] ACOUSTIC CHARGE TRANSPORT DEVICE AND METHOD

[75] Inventors: Billy J. Hunsinger, Mahomet; Michael J. Hoskins, Urbana, both of Ill.

[73] Assignee: University of Illinois, Ill.

[21] Appl. No.: 515,846

[22] Filed: Jul. 21, 1983

Related U.S. Application Data

[63] Continuation-in-part of Ser. No. 406,751, Aug. 10, 1982.

[51] Int. Cl.⁴ .............................................. H01L 29/84
[52] U.S. Cl. ........................................ 357/26; 357/15; 357/24
[58] Field of Search .................... 357/26, 15, 24 M, 24

[56] References Cited

U.S. PATENT DOCUMENTS

| | | | |
|---|---|---|---|
| 3,675,140 | 7/1972 | Fang et al. | 330/515 |
| 3,714,609 | 1/1973 | Whitney et al. | 330/5.5 X |
| 3,792,321 | 2/1974 | Seifert | 357/26 X |
| 3,827,002 | 7/1974 | Chao | 357/26 X |
| 3,858,232 | 12/1974 | Boyle et al. | 357/24 |
| 3,877,982 | 4/1975 | Colbren et al. | 357/26 X |
| 3,935,564 | 1/1976 | Quate et al. | 357/26 X |
| 4,005,318 | 1/1977 | Claiborne, Jr. | 357/26 X |
| 4,005,376 | 1/1977 | Davis | 357/26 X |
| 4,019,200 | 4/1977 | Adkins et al. | 357/26 |
| 4,122,495 | 10/1978 | Defranould et al. | 313/313 B X |
| 4,233,573 | 11/1980 | Grudkowski | 333/152 X |
| 4,354,166 | 10/1982 | Grudkowski | 333/152 X |
| 4,401,956 | 8/1983 | Joshi | 333/152 |

FOREIGN PATENT DOCUMENTS

2714032  10/1978  Fed. Rep. of Germany ........ 357/26

OTHER PUBLICATIONS

Gaalema et al., "Acoustic Surface Wave Interaction Charge-Coupled Device," *Applied Physics Letters*, vol. 29, No. 2, Jul. 15, 1976, pp. 82–83.

Papanicolaou et al., "A Monolithic Surface Acoustic Wave Charge Transfer Device and Its Applications," *Optical Engineering*, Jul./Aug. 1980, vol. 19, No. 4, pp. 587–589.

Tsubouchi et al., "Charge Transfer by Surface Acoustic Waves on Monolithic MIS Structure," 1978 *IEEE Ultrasonics Symposium Proceedings*, No. 78, CH1344-ISU, 1978.

Augustine et al., "Experimental Observation of Charge Transfer by Surface Acoustic Waves in a Monolithic Metal/ZnO/SiO₂/Si(MZOS) Device," 1981 Electronics Symposium, Tech. Report No. TR-EE81-24, Aug. 1981.

*Primary Examiner*—William D. Larkins
*Assistant Examiner*—William A. Mintel
*Attorney, Agent, or Firm*—Martin Novack

[57] ABSTRACT

The disclosure is directed to a method and a device for delaying an electrical signal, the method and device being useable in various signal processing applications. A buried channel is formed by disposing a portion of a layer of piezoelectric semiconductor material between confining layers. A surface acoustic wave is established in the piezoelectric semiconductor material. Majority carriers are depleted from the channel, and an electrical signal is injected into the channel. A delayed version of the electrical signal, which had been carried along by the surface acoustic wave, can then be extracted from the channel.

37 Claims, 15 Drawing Figures

ACOUSTIC CHARGE TRANSPORT DEVICE AND METHOD

This invention was made with Government support under Contract N00014 79-C-0424 awarded by the Department of the Navy. The Government has certian rights in this invention.

This is a continuation-in-part of U.S. patent application Ser. No. 406,751, filed Aug. 10, 1982.

BACKGROUND OF THE INVENTION

This invention relates to electronic semiconductor devices and, more particularly, to an acoustic charge transport technique and delay device that is compatible with integrated circuit technology and which has applications including filtering, convolution, correlation, and other signal processing functions which employ delay elements. The device hereof also has application as an analog register and a video signal generator.

Surface acoustic wave ("SAW") devices have been developed to provide reasonably low cost and power-efficient devices for use as delay lines and filters, and in other signal processing applications. However, a difficulty with "SAW" devices is that they are generally implemented on dielectric substrates that tend to be incompatible with existing integrated circuit technology. This makes it difficult to combine the gain and control capability of integrated circuit semiconductor technology with the high computational speed of "SAW" devices to get cost-effective monolithic signal processors.

Devices which are generally compatible with integrated circuit technology, and which are useful in the above-mentioned types of applications are charge-coupled devices ("CCD"). CCD's are being developed on different types of substrates including silicon and gallium arsenide, and great advances have been made in CCD technology in recent years. However, CCD's require a large number of closely spaced gates and associated connections, along with clock driver circuitry. Operation of CCD's at high speeds remains difficult.

It has been previously recognized that "SAW" devices could be used in conjunction with silicon wafers to obtain travelling potential wells in the silicon, and that signal charge could be injected into the potential wells. However such devices can exhibit charge transport inefficiency due to carriers being dragged along a surface and surface states trapping some of the carriers as they go by.

It is among the objects of this invention to provide an improved charge transport device and technique that is compatible with integrated circuit technology and exhibits good charge transport efficiency.

SUMMARY OF THE INVENTION

The present invention is directed to an acoustic charge transport method and device that has applications for delaying electrical signals, optical processing and other signal processing. In accordance with the method of the invention, a buried channel is formed by disposing a portion of a layer of piezoelectric semiconductor material between confining layers. A surface acoustic wave is established in the piezoelectric semiconductor material. Majority carriers are depleted from the channel, and electrical charge is injected into the buried channel. A delayed version of the electrical charge, which has been carried along by the surface acoustic wave, is then extracted.

In accordance with the device of the invention, there is provided a support layer, and a layer of piezoelectric semiconductor material disposed over the support layer. In an embodiment of the invention, the piezoelectric semiconductor material is N-type gallium arsenide, and the support layer is semi-insulating gallium arsenide. A conductive barrier layer is disposed over a region of the piezoelectric semiconductor material, and defines a channel in the region of piezoelectric semiconductor material beneath the barrier layer. A surface acoustic wave transducer is disposed on the piezoelectric semiconductor material, and is used to establish a surface acoustic wave in the piezoelectric semiconductor material that propagates through the channel. Means are provided for injecting an electrical signal into the channel. Further means are provided for extracting a delayed version of the electrical signal from the channel after the electrical signal has been carried along by the surface acoustic wave.

In an embodiment of the invention, multiple non-destructive taps can be provided between portions of the conductive barrier layer to obtain a tapped delay line.

In a further embodiment of the invention, the potential in different portions of the buried channel is selectively controlled to temporarily prevent the electrical charge from being carried along by the surface acoustic wave. In this manner the device can be utilized as an analog or digital shift register. The input thereto can be series or parallel electrical inputs or an optical input.

The disclosed method and device can achieve high speed and efficient operation, in some embodiments without the need for multiple gates and clock circuitry, and is compatible with integrated circuit technology.

Further features and advantages of the invention will become more readily apparent from the following detailed description when taken in conjunction with the accompanying drawings.

DESCRIPTION OF THE PREFERRED EMBODIMENTS

Figure 1A:
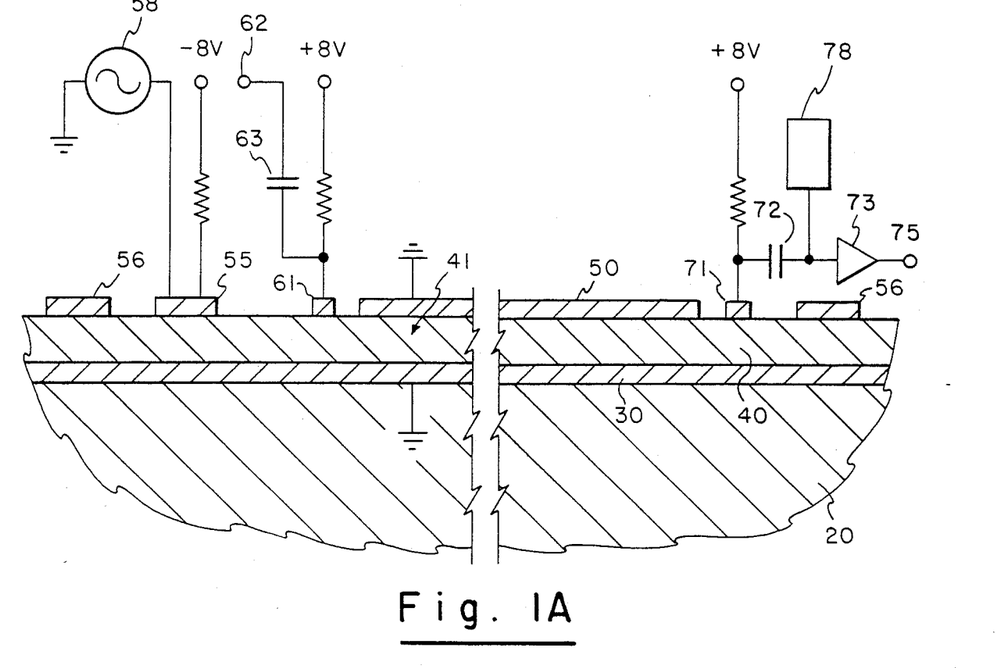
FIG. 1A is a cross-sectional view of device in accordance with the invention and which can be used to practice the method of the invention.

Referring to FIG. 1A, there is shown an electronic delay device in accordance with an embodiment of the invention and which illustrates principles of the invention. A chromium-doped gallium arsenide semi-insulating substrate 20 has a P-type buffer layer 30 of gallium arsenide thereon. An N-type layer of gallium arsenide 40 is disposed on the layer 30. A Schottky barrier metal contact 50 is disposed over a region of the N-type layer 40 and defines a channel 41 in the N-type piezoelectric semiconductor material 40 that is beneath the Schottky barrier layer. An acoustic interdigital transducer 55 is disposed on the layer 40 in spaced relation to the barrier layer 50. An ohmic contact 61, which in conjunction with the layer 40 and the Schottky barrier layer 50, comprises a positively biased input diode in this structure, is disposed on the layer 40 in the region between the barrier layer 50 and the transducer 55, and preferably in close proximity to the barrier layer 50. An ohmic contact 71, which, in conjunction with the layer 40 and the Schottky barrier layer 50, comprises a positively biased output diode in this structure, is disposed on the layer 40 in close proximity to the other end of barrier layer 50. Acoustic absorbers 56 are disposed on layer 40, as shown. An energizing signal to the negatively biased piezoelectric transducer 55 is provided from source 58. An input electrical signal is applied to diode 61 via input terminal 62 and capacitor 63. The output signal from diode 71 is applied to output terminal 75 via capacitor 72 and amplifier 73.

Figure 2A:
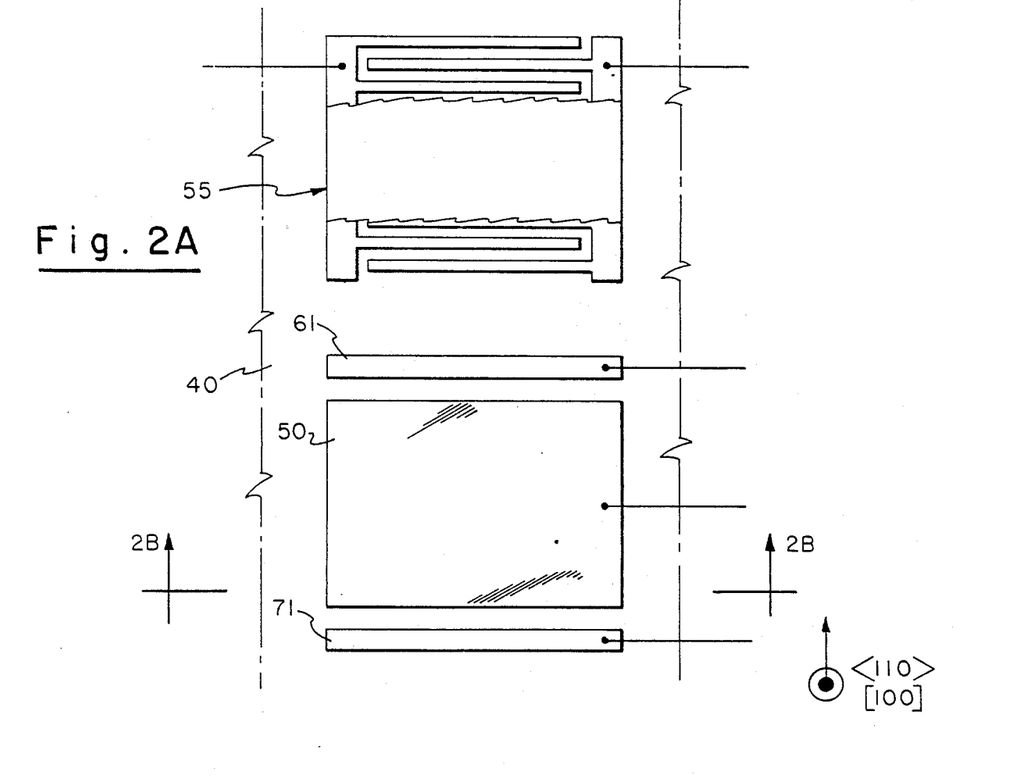
FIG. 2A is a plan view of the device of FIG. 1.
Figure 2B:
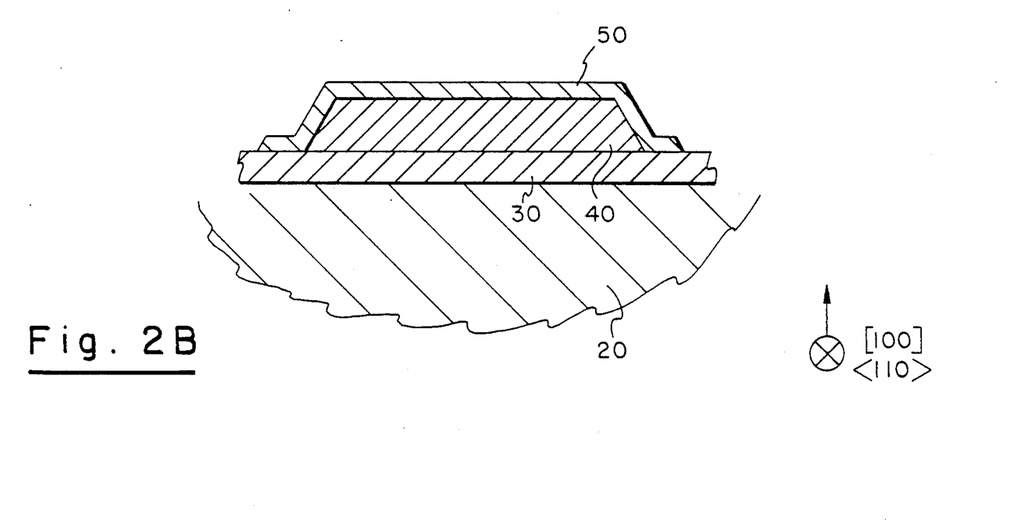
FIG. 2B is a cross-sectional view as taken through a section defined by arrows 2B—2B of FIG. 2A.

Forms of the physical geometry of the multilayer buried channel structure are further shown in FIGS. 2A and 2B. In an operating embodiment, the layers, grown by molecular beam epitaxy on [100] cut Cr doped GaAs substrate 20, were a 1.7 microns thick P layer (Na~$10^{15}$cm$^{-3}$) 30 and a 4.7 microns N layer (Nd~$10^{15}$cm$^{-3}$) 40. The device transfer channel, oriented in the <110> direction, is delineated by a preferential mesa etch to a depth of 5 microns as shown in FIG. 2B. Ohmic contacts to the input and output diodes and to the exposed P layer are formed using the lift off process. After the contacts are alloyed the Al Schottky barrier 50, acoustic interdigital transducer 55, and interconnect pads are formed using standard photolithographic techniques. The interdigital transducer 55, which has approximately 100 electrode pairs in this embodiment, generates a 7.9 microns wavelength SAW over a beam width of 150 wavelengths at a source (58) frequency of 367.1 MHz. The transport channel is 1 mm wide and 1.55 mm long in this embodiment, corresponding to an acoustic delay between the input and output diodes of about 0.54 microseconds.

Depletion of the channel electrons under the Schottky barrier 50 is achieved in this embodiment by biasing the diodes 61 and 71 with about 8 volts (FIG. 1). The generating efficiency of the SAW transducer 55 is increased significantly when it is also biased, again with about 8 volts, such that the N type region underneath the electrodes is depleted. This insures that the transducer fields are not screened by charge carriers in the vicinity of the electrodes. A reverse biased metal isolation bar (not shown) can be disposed between the transducer 55 and the diode 61 to prevent electrons from the transducer from entering the channel. Further considerations of isolation in devices pursuant to the invention are discussed below.

Figure 3:
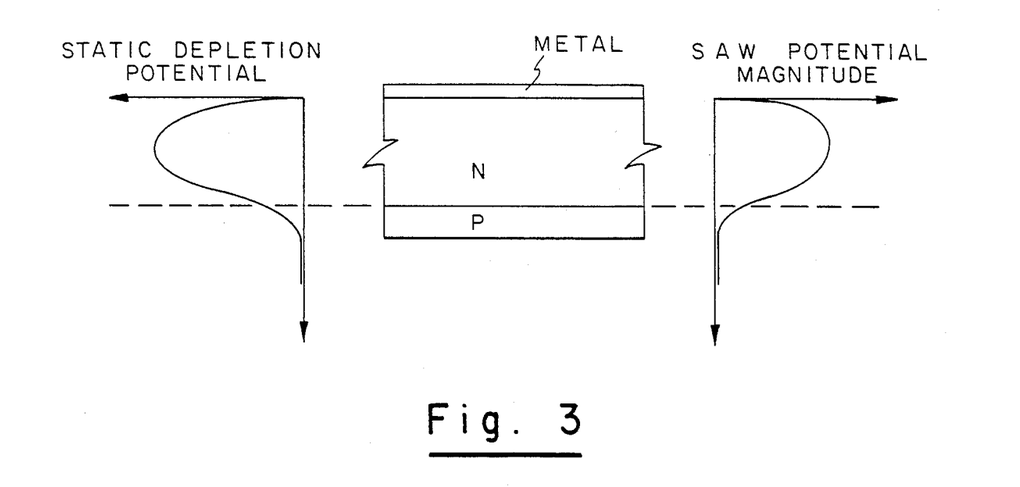
FIG. 3 shows the SAW potential magnitude and the static depletion potential in the buried channel of the device.

FIG. 3 shows the depletion potential and the SAW potential magnitude within the depleted channel. If the depth of the channel is roughly one half of an acoustic wavelength, the SAW potential profile within the depleted region peaks in the center of the channel when the wave is fully screened by the surface metal and the conductive P layer. Both the depletion potential and the SAW potential provide electron confinement to the channel center, although the depletion potential is more important in this regard because it is the larger of the two.

Figure 1B:
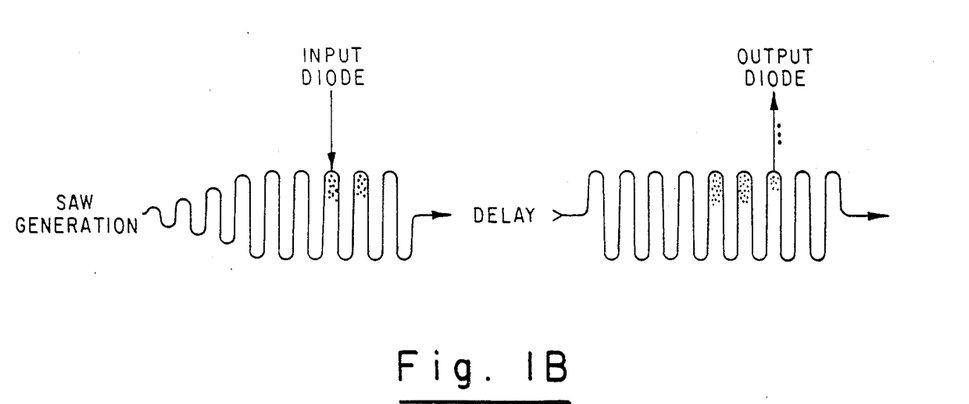
FIG. 1B illustrates, in simplified terms, operation of the FIG. 1 device.

Charge carriers can be injected into the wave, for example, by applying a short negative pulse to the input diode. FIG. 1B shows the interaction of the wave with the injected charge. Electrons diffusing toward the P layer 30 and the Schottky barrier 50 are bunched and translated down the channel by the potential wells of the SAW. When the wave amplitude is large the injected electrons quickly reach a steady state condition whereby the charge moves synchronously with the wave, with each packet moving precisely at the sound velocity. Upon reaching the output diode 71, the delayed charge packets are swept out of the wave by the applied reverse bias resulting in a current spike in the output detection circuit.

In the absence of charge loading and diffusion effects, it has been previously shown that the minimum wave electric field necessary for the transport to occur is $V_s/u = 40$ V.cm$^{-1}$ where $V_s$ is the sound velocity and u is the mobility of electrons in GaAs. The rather large electron mobility in GaAs allows the synchronous condition to be achieved with relatively small wave potential, particularly when the SAW frequency is large. Transducer insertion loss measurements can be used to obtain estimates of the acoustic power flowing in the channel. From this calculation the wave potential and electric field can be calculated. In applicants' experiments the acoustic power is about 10 mW resulting in a peak wave potential of 0.077 V and a peak electric field of ~600 V/cm.

Figure 4:
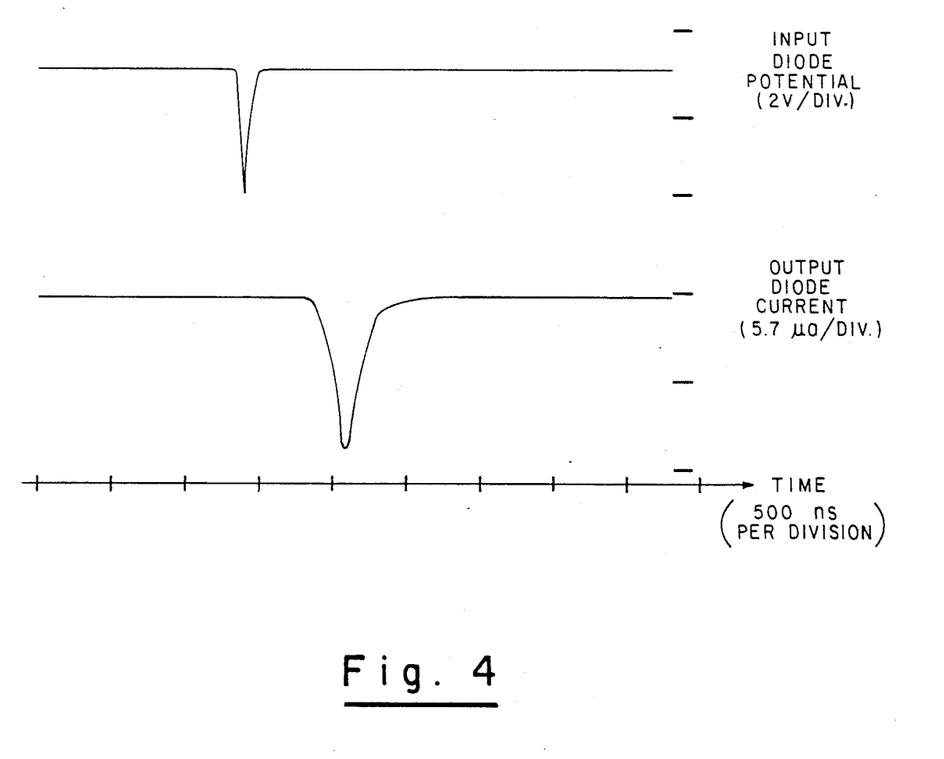
FIG. 4 shows the output diode current obtained for a pulse applied to the input diode of the device.

FIG. 4 shows an oscillograph of the output diode current that was obtained by applying a 100 ns duration pulse to the input diode while the SAW transducer 58 was driven by an 8 microseconds 367 MHz R.F. burst. The 0.54 microseconds acoustic delay between the contacts was observed, showing that the injected charge is moving synchronously with the wave.

Figure 5:
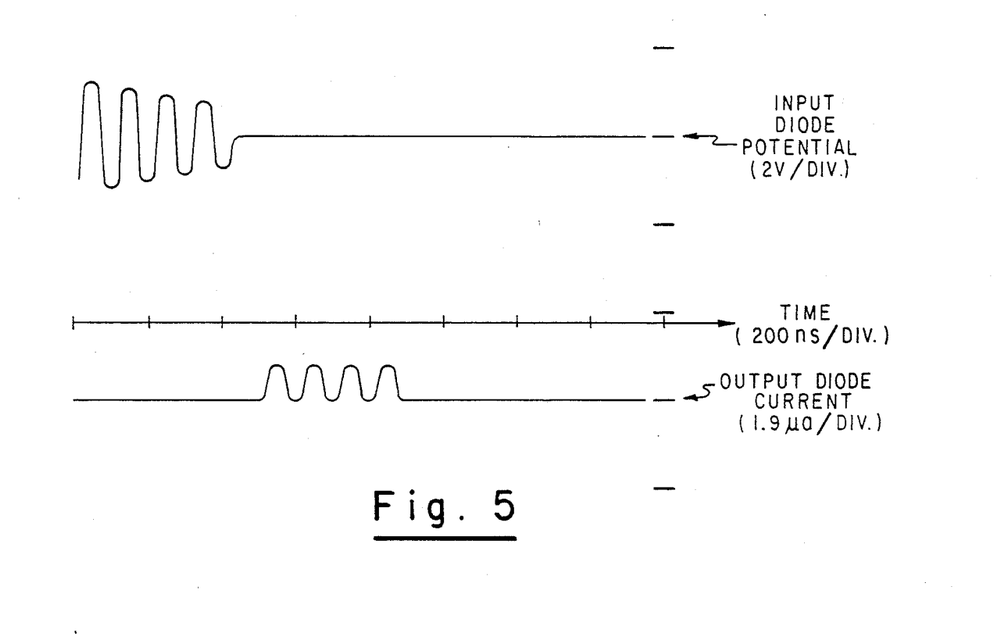
FIG. 5 illustrates the output diode current for an R.F. burst of 10 MHz applied to the input diode of the device.

The response of the charge transport delay line to an R.F. burst at 10 MHz is shown in FIG. 5. The output amplifier was inverting in this experiment, so an electron output current appears as a positive trace deviation. The response is a close replica of the input waveform delayed by 540 ns. Of special interest was the absence of an interfering signal in the output due to radiated or acoustic pickup at the SAW frequency. The interfering signals are suppressed by using a high Q narrowband reject filter 78 at the SAW frequency, as shown in FIG. 1.

It will be understood that there were several factors which limited the performance of the described experimental SAW transport device. It was learned that the bandwidth of the device was limited primarily by the RC time constants associated with the input and output diodes, an effect which can be significantly reduced by positioning the diodes in closer proximity to their Schottky barrier. Input gates for charge injection can reduce the disadvantages of a poorly defined injection region and the removal of some charge from the wave when the input contact returns to the bias potential. Also, the wave power in the channel was limited by the large insertion loss in the SAW transducer due to fabrication imperfections in the electrodes. Nevertheless, applicants believe that their experiments indicate that the disclosed transport process and device is potentially suitable for implementation of high speed, large time-bandwidth product, large dynamic range monolithic delay elements.

Figure 6A:
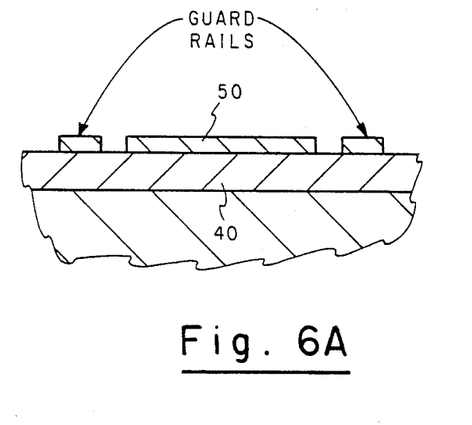
FIGS. 6A and 6B illustrate alternatives for lateral confinement.
Figure 6B:
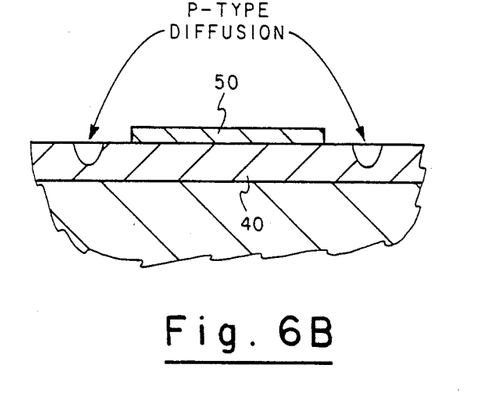

In the previously described embodiment, lateral channel confinement was achieved with a mesa approach. Alternative techniques can be employed. For example, metal guard rails, such as are shown in FIG. 6A (and used in conjunction with a bias ring, as described below), or P-type diffusions, as shown in FIG. 6B, can be employed to help confine charge packets to the channel.

Figure 7:
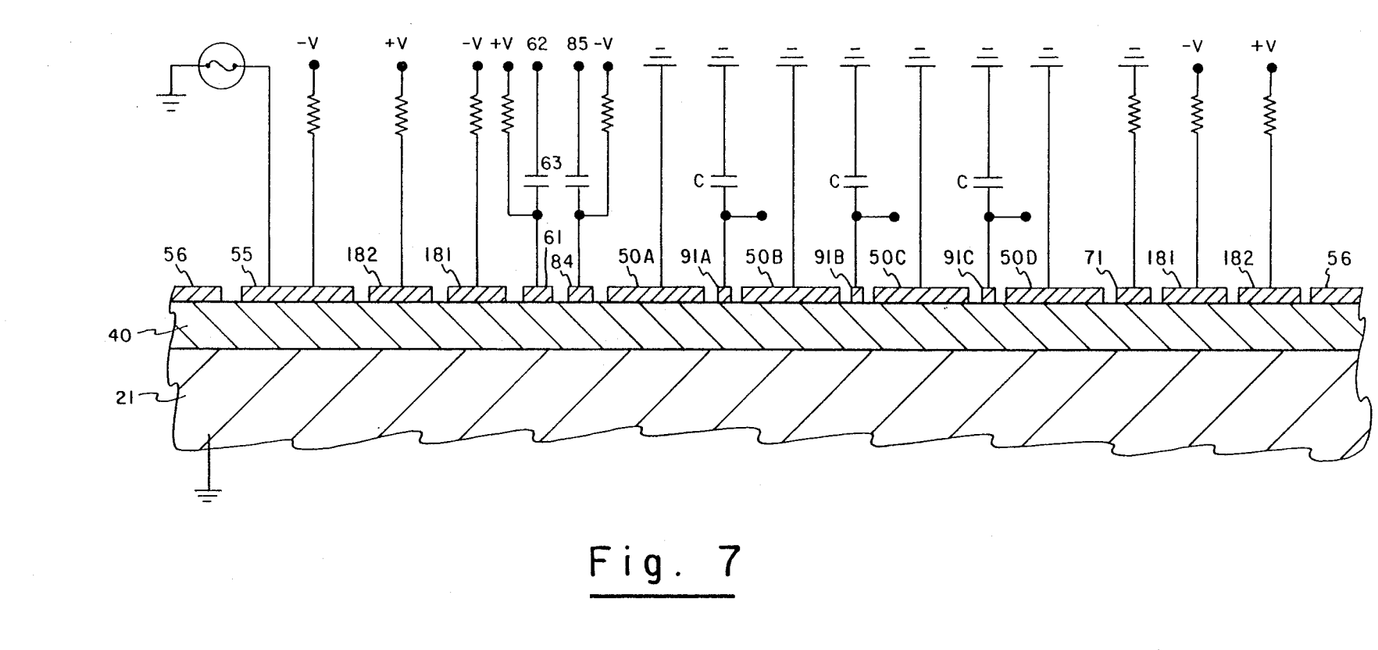
FIG. 7 shows a cross-sectional view of a device in accordance with another embodiment of the invention, including non-destructive voltage sensing taps.
Figure 9:
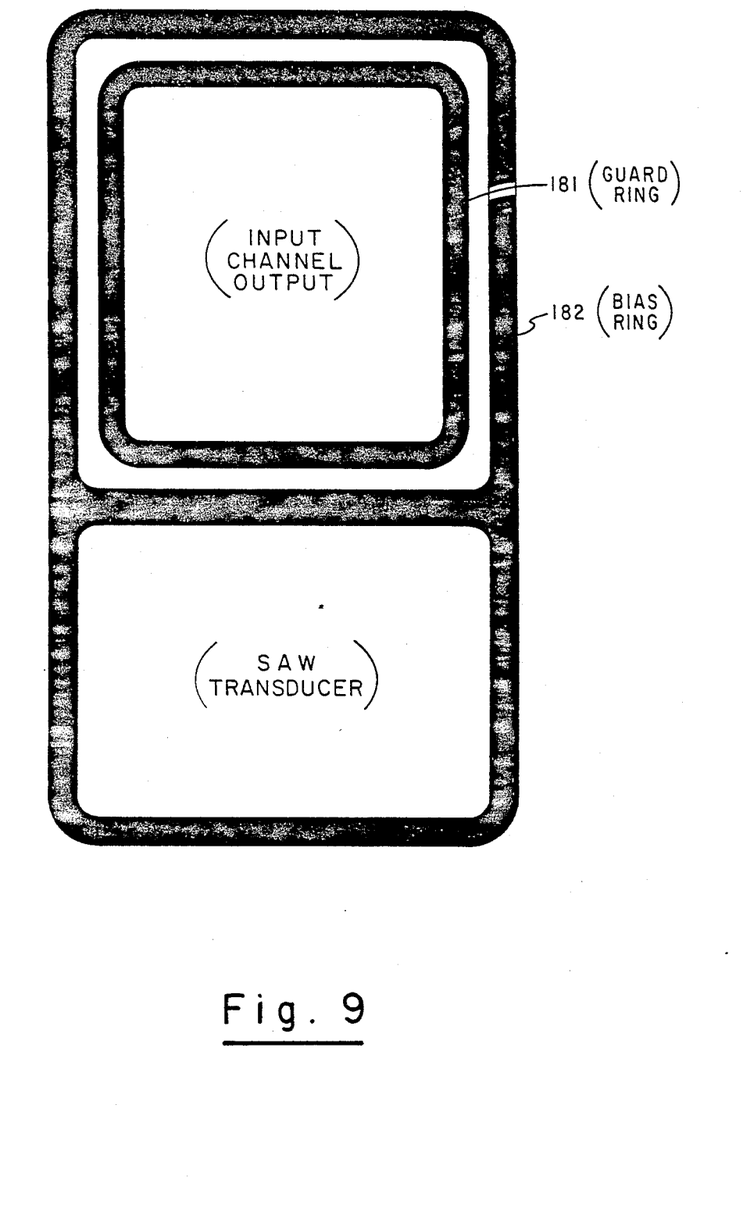
FIG. 9 is a simplified plan view which shows the guard and bias rings.

In the previously described embodiment a single delay section and diode are shown, but it will be understood that multiple delay sections and output sensing elements or taps can be employed. FIG. 7 illustrates a configuration wherein three receiving taps are employed. The piezoelectric semiconductor layer 40, SAW 55, acoustic absorbers 56, and input diode 61 and output diode 71 (used as a termination in the illustrated embodiment) correspond to their counterparts in FIG. 1. The barrier layer portions 50A, 50B, 50C and 50D correspond to barrier layer 50 of FIG. 1, and the recited elements can be biased and energized in a manner similar to previous description. In this embodiment, a guard ring 181 and a bias ring 182 are illustrated and surround most of the device as shown in FIG. 9. The guard ring 181, a Schottky barrier metal ring, is biased more negatively than anything else. It serves to deplete the channel and provide electrical isolation between the channel (and its associated input and output structures) and the rest of the epi-layer 40. The bias ring 182 clamps the layer 40 to a defined positive potential so that electrons outside the guard ring cannot enter the channel. Leakage current which may be generated under the guard ring is shunted away from the channel region by the bias ring. A further ring of the bias ring 182 can surround the SAW transducer 55, as shown in FIG. 9.

A negatively biased input gate 84 is utilized in this embodiment, and has a control terminal 85. The negative bias prevents electrons from diode 61 from entering the channel. A plurality of metal barrier taps 91A, 91B and 91C are respectively disposed after the barrier sections 50A, 50B and 50C. Each tap has an associated output terminal and is also coupled through a capacitor C to ground. Applicants have discovered that the taps are non-destructive of the signal as it is passed and is sensed. This will be described further hereinbelow. Also, in the embodiment of FIG. 7, the support layer 21 is a semi-insulating substrate of chromium-doped gallium arsenide, and there is no additional P-type layer of gallium arsenide, as in the FIG. 1 embodiment, although such a layer can be included, if desired. Advantageous fabrication can also be implemented using vapor phase epitaxy on liquid encapsulated Czochralski semi-insulating substrates. Other epitaxial growth techniques can also be used. Also, techniques such as diffusion and ion implantation are being considered.

In operation of the FIG. 7 embodiment, the signal from input diode is injected into the channel (which effectively includes the region under gate 84 when it is biased on) and proceeds toward the output diode 71, being transported along the channel by the travelling wave electric field produced by the SAW. At each tap a delayed version of the input signal is obtained, the amount of delay being dependent upon the selected geometry and SAW propagation velocity.

When a charge packet is injected into the device channel, to be transported by the wave down the channel, the electric fields associated with the charge packet interact with any electrically conductive structures which are in proximity to the transport channel. The net effect of this interaction is to create a charge distribution in the conductors whose electric fields tend to cancel the fields set up by the charge packet. The simplest geometry to consider in this case is a metallic conducting plane parallel to the transport channel which lies on the surface of the device. The charge which collects in the metal can be referred to as the "image" charge. (This image will occur in any conductive structure, including, for example, a conductive P type layer.)

The image charge will move with its corresponding charge packet as the wave moves the charge down the channel. If the conductive structure is a perfect conductor, then the wave expends energy only to move the charge in the channels and the image charge rides along "free." If the conductive structure has some resistance associated with it, then the wave must expend additional energy to move the image charge. In the practical cases to be considered here, the conductive structure should have low enough resistance that this additional energy can be considered to be negligible. The concept of the image charge is clarified by introducing the idea of an equivalent capacitance. In this model the transported charge resides on one plate of the equivalent capacitor while the image charge resides on the other. The sum of all charge in the image plate exactly equals the sum of all the charge in the transported packet except that the image charge has the opposite polarity of the transported charge.

The ability to non-destructively sense the transported charge as it moves along the channel is made possible by monitoring the currents associated with the image charge. This is illustrated in simplified form in FIG. 8. A small gap is introduced in the conductive metal structure and a current sensing instrument (such as a resistor) is inserted between the two conductors to sense the current associated with the movement of the image charge.

The voltage across the gap induced by the image current through the resistor can represent the output signal of the non-destructive "tap." If the value of the resistor is chosen to be too large, this potential difference will "tilt" the potential wells of the wave, letting charge leak out of the transported packet. However, it can be shown that for values of R which give good detection sensitivity this effect is very small, provided the gap is very small. The power delivered to the resistor comes from the wave which works to push the charge across the gap. Hence, for appropriate values of R, as noted, the signal (charge packet) is substantially unperturbed even though the power is dissipated in the resistor. The power lost from the wave will decrease the magnitude of the wave potential wells only slightly. This decrease in wave potential well size does not affect the charge in the well because of the strong non-linearity of the transport process. In other words, there are many well depths which can carry the same size charge packet.

Figure 8:
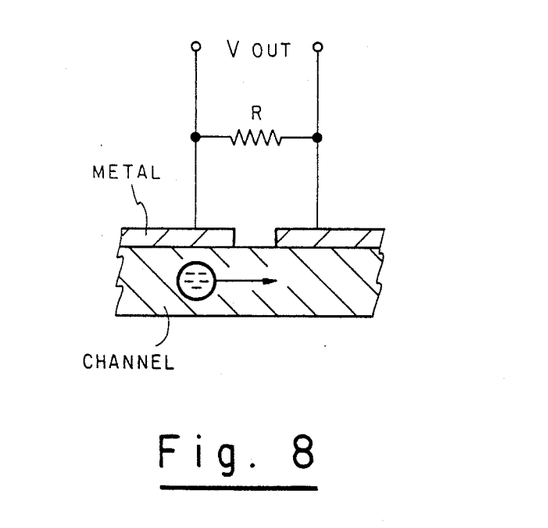
FIG. 8 illustrates a form of non-destructive current sensing tap.

Multiple signal taps of the form shown in FIG. 8 use a floating current detector for each tap and can tend to be impractical when a large number of non-destructive taps are desired. A voltage sensing configuration, which does not require floating detectors, is employed in conjunction with the FIG. 7 taps. In this case, an independent metal electrode is situated between grounded sections of the metal plate. As the transported charge moves under this electrode, the corresponding image charge proceeds from ground through the capacitor (via displacement current), onto the sense electrode. The capacitor integrates this current, giving an output voltage which varies in proportion to the amount of transport charge under the sense electrode. When the transport charge finishes its transit across the sense electrode, the same process occurs, discharging the capacitor, the voltage across it collapsing correspondingly. Thus, longer impulse responses can be achieved by making the sense electrode longer. Also, if desired, the signals from these electrodes can be readily summed, for example, by connecting them all to the same buss bar. In addition, the strength of each electrode can be varied by adjusting the width of the electrode. These characteristics can be useful for signal processing applications. Further, multiple injection means could be respectively employed at tap positions (for taps designed for injection) and a combined output extracted from an end of the channel.

Figure 10:
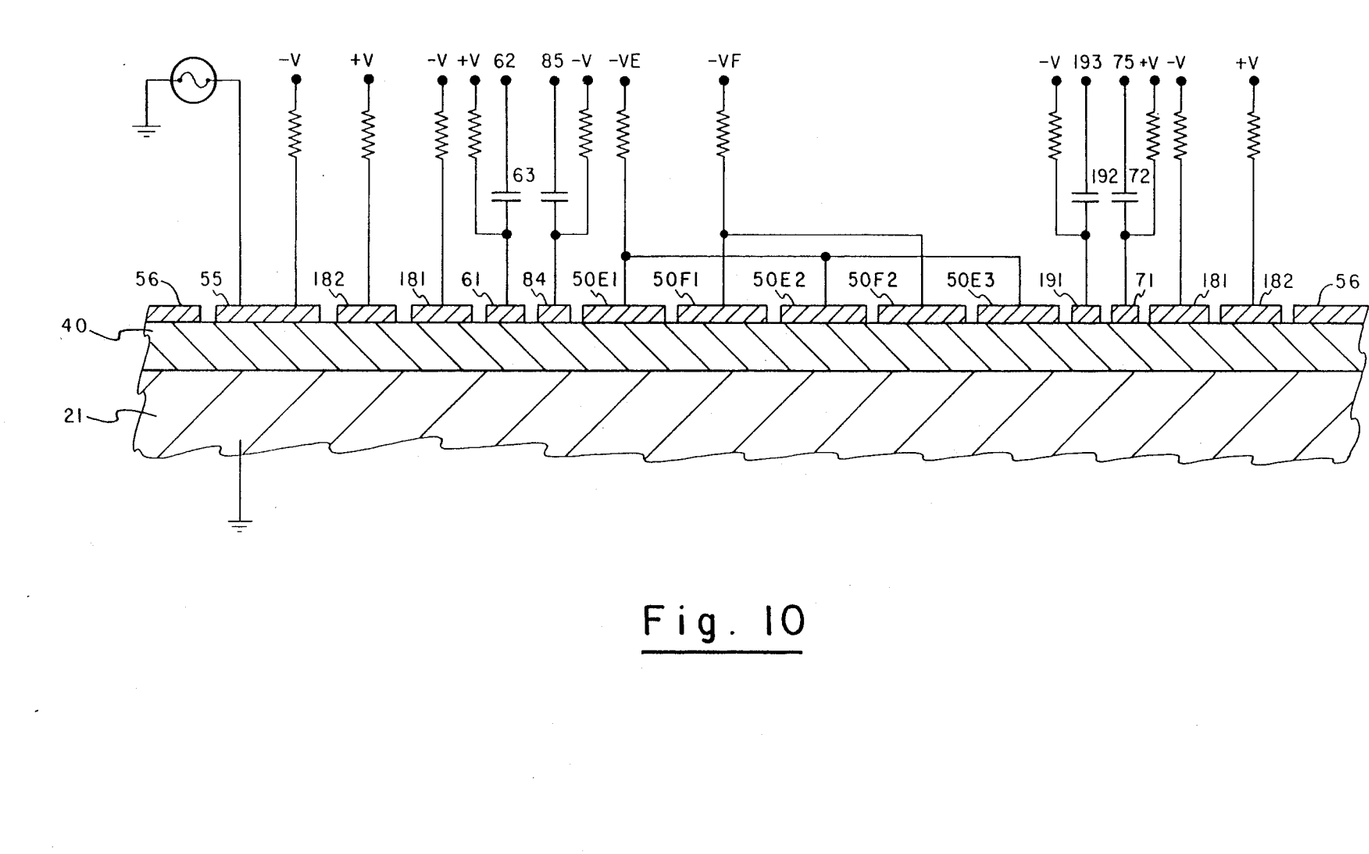
FIG. 10 shows a cross-sectional view of a device in accordance with another embodiment of the invention wherein control voltages are used to control the progress of signals in a channel.

Referring to FIG. 10 there is shown an embodiment of the invention which can be used, inter alia, as an analog or digital register device in which input signals are controlled with clock signals or other control signals. The semi-insulating substrate 21 and the layer 40 may be substantially the same as in the FIG. 7 embodiment. Also, the transducer 55, absorbers 56, guard ring 181, bias ring 182, input diode 61, and input gate 84 may be substantially as shown in FIG. 7. In the FIG. 10 embodiment, a negatively biased output gate 191, under control of a signal applied via control terminal 193 and capacitor 192 is used to gate the output signal. An output gate can, of course, also be used in other embodiments. The barrier layer of the FIG. 10 embodiment includes portions designated 50E1, 50E2, and 50E3, and between these other portions designated 50F1 and 50F2. The control or clock voltage applied to the three (in this example) "E" barrier layer portions is designated VE, and the control or clock voltage applied to the two "F" barrier layer portions is designated VF. As in the case of other embodiments of the invention where the channel barrier layer is divided into a plurality of portions, if the gaps between adjacent portions are very small, the effect on potential variation will be minimized.

An example of a procedure for operating the FIG. 10 embodiment is as follows: If VE=VF, the device will initially act like the device of FIG. 1. (A suitable voltage, VE=VF, for normal transport operation will depend upon several factors, including the SAW wavelength, the thickness and doping density of the layer 40, and the type of substrate.) Next, assume that an input signal is sampled and applied to the channel input (via input terminal 62, and under control of a gate control signal applied to terminal 85) using timing that causes signal charge packets to be spaced in time such that they are simultaneously under successive "E" portions of the barrier layer; i.e. barrier layer portions 50E1, 50E2, and 50E3. (This can be achieved, for example, by setting the sampling period equal to the distance between the centers of the "E" portions divided by the velocity of SAW wave.) The same timing associated with the input signal sampling can then be used to switch the voltages −VE and/or −VF such that −VE is less negative than −VF (such as, 6 volts less negative). This will result in small storage wells being effectively positioned beneath the "E" barrier layer portions, which will result in the charge packets thereunder being trapped, even in the presence of the SAW wave attempting to sweep them along. To release the charge packets so that they can continue on toward the output (e.g. after a selected delay), −VE can again be set equal to −VF. It will be understood that if there is a lack of precise synchronization with the input sampling, there may be averaging of samples, which may be acceptable or even desirable, depending upon the application of the device. Also, it will be understood that barrier layer portions of this and other embodiments may be used for optical inputs and/or non-destructive sensing taps, e.g. described herein.

Figure 11:
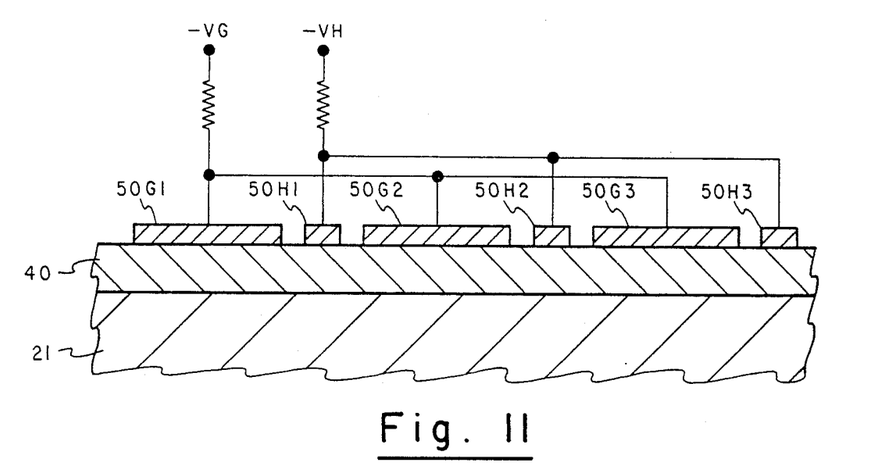
FIG. 11 shows a variation of the FIG. 10 embodiment.

FIG. 11 illustrates the barrier layer portions of another version of the FIG. 10 embodiment, the remainder of the device being similar to that shown in FIG. 10. In this case, the progressing charge packets are confined under the barrier layer portions 50G1, 50G2, and/or 50G3 by virtue of potential barriers temporarily established under the small barrier layer portions 50H1, 50H2 and 50H3. In operation, the voltages −VG and −VH can initially be the same, with −VH being switched to a more negative voltage at the time when it is desired to establish under the "H" electrodes a barrier which prevents the charge packets from continuing to be carried along by the SAW wave. The voltages can then, at a desired time, be made equal again to release the charge packets so they can continue to be carried along by the SAW wave.

Figure 12:
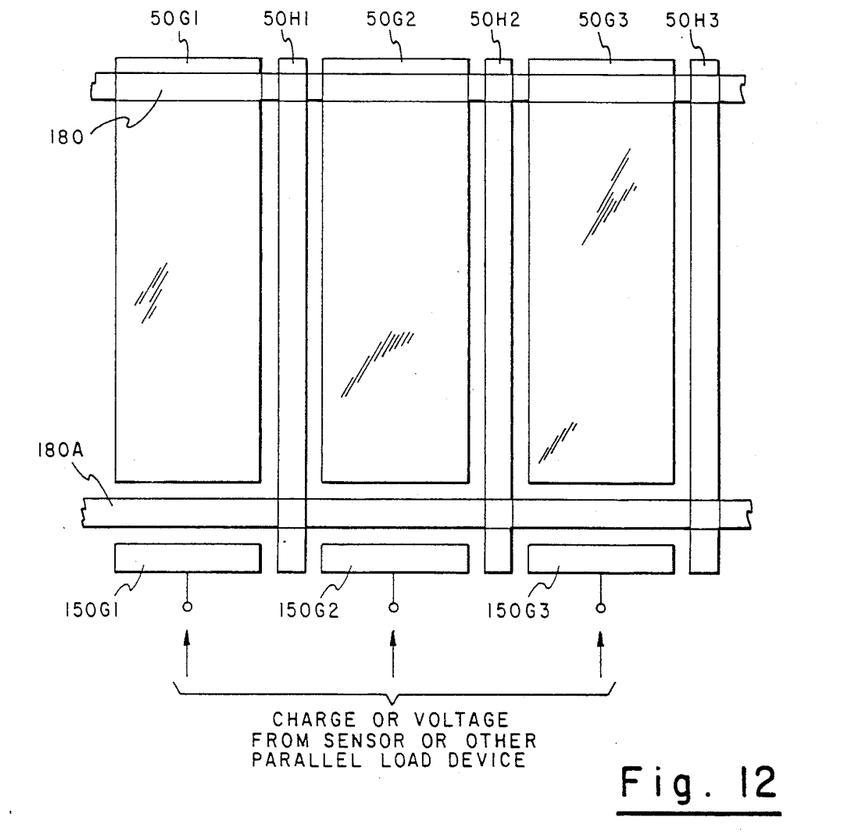
FIG. 12 shows another embodiment of the invention which includes a parallel loading feature.

Referring to FIG. 12, there is shown a version of the FIG. 11 embodiment wherein the charge can be injected in parallel into the regions in the channel beneath the barrier layer portions 50G1, 50G2 and/or 50G3, from electrodes 150G1, 150G2 and/or 150G3. A portion of the guard ring, designated 180A, is used as a gate to control transfer of the charge from the electrodes 150G1, 150G2 and 150G3 (which are preferably ohmic contacts), to the regions beneath barrier layer portions 50G1, 50G2 and 50G3. The barrier layer portions 50H1, 50H2 and 50H3 can extend past the guard ring portions 181A so as to also provide isolation of the electrodes 150G1, 150G2 and 150G3. The electrodes 150G1, 150G2 and 150G3 can be optimized optical sensors used, for example, for sensing a line of optical information, and a field of video information can be produced from a series of side-by-side lines. Alternatively, the device can be used, for example, for parallel-in-serial-out applications where the electrical signals to be read in are applied to terminals coupled to the electrodes 150G1, 150G2, and 150G3. Operation, after transfer of the input signals to the channel regions, can be as described in conjunction with FIG. 11, with controlled read-out of the stored charge packets being achieved, for example, by changing the voltage on barrier layer portions 50H1 and 50H2. For serial-in-parallel-out operation, the electrodes 150G1, 150G2 and 150G3 can be used to obtain the parallel output signals from the channel.

In the illustrative embodiments hereof, the buried layer in which most of the acoustic wave energy (and accompanying electromagnetic potential) and the transported electrical signal travels is a layer of N-type gallium arsenide grown on one or more layers of gallium arsenide support and/or confining layers. In such case, each layer is a semiconductor which exhibits piezoelectricity. While this is preferred, it is only necessary that the first-mentioned buried layer be piezoelectric semiconductor. Also, a heterojunction structure may be used wherein, for example, the confining layer beneath the gallium arsenide is aluminum gallium arsenide. Other materials may also be used. Further, while metal barrier layers have been illustrated, it will be understood that other conductive layers, such as a conductive P-type semiconductor layer (which may be transparent) can be employed for this purpose.

The invention has been described with reference to particular preferred embodiments, but variations within the spirit and scope of the invention will occur to those skilled in the art. For example, counter-propagating channels with mutual coupling could be used to implement a convolver. Gallium arsenide has photosensitivity to near infrared and visible light. As indicated above, the disclosed technique can be employed in image detection applications. The light can be received through openings in the barrier layer, through a transparent barrier or the back side of the device, or can be received by auxiliary sensors and transferred to the channel. Further, a light source can be used as one or more discrete injection means.

We claim:

1. A semiconductor device, comprising:
    a support layer;
    a layer of piezoelectric semiconductor material disposed over said support layer;
    a conductive barrier layer disposed over a region of said piezoelectric semiconductor material and defining a channel in the piezoelectric semiconductor material beneath the barrier layer;
    transducer means disposed on said piezoelectric semiconductor material for receiving a transducer energizing signal and establishing a surface acoustic wave in said piezoelectric semiconductor material that propagates through the channel;
    means, other than said transducer means, for injecting into the channel an input electrical charge signal; and
    means for extracting a delayed version of the input electrical signal from the channel after said input electrical signal has been carried along by the surface acoustic wave.

2. The device as defined by claim 1, further comprising means for depleting majority carriers from the channel.

3. The device as defined by claim 2 wherein said support layer is also a piezoelectric semiconductor material.

4. The device as defined by claim 2 wherein a confining layer of semiconductor material is disposed between said support layer and said layer of piezoelectric semiconductor material.

5. The device as defined by claim 2 wherein said layer of piezoelectric semiconductor material is gallium arsenide.

6. The device as defined by claim 5 wherein said support layer is gallium arsenide.

7. The device as defined by claim 5 wherein said layer of piezoelectric semiconductor material is N-type gallium arsenide and said support layer is semi-insulating gallium arsenide.

8. The device as defined by claim 2 wherein said means for injecting and means for extracting comprise diodes disposed on the surface of said layer of piezoelectric semiconductor material on opposite sides of said barrier layer.

9. The device as defined by claim 7 wherein said means for injecting and means for extracting comprise diodes disposed on the surface of said layer of piezoelectric semiconductor material on opposite sides of said barrier layer.

10. The device as defined by claim 2 wherein said transducer means comprises an interdigitated transducer.

11. The device as defined by claim 2 wherein said barrier layer has a plurality of spaced openings therein such that said barrier layer is divided into barrier layer portions.

12. The device as defined by claim 11 wherein said electrical signal is caused to be injected into the channel by incident light.

13. The device as defined by claim 11, further comprising a plurality of taps disposed over said channel in the openings of said barrier layer, and wherein delayed versions of said electrical signal are extracted at said taps.

14. The device as defined by claim 12, further comprising a plurality of taps disposed over said channel in the openings of said barrier layer, and wherein delayed versions of said electrical signal are extracted at said taps.

15. The device as defined by claim 11, further comprising means for applying control voltage potentials to said barrier layer portions to control the presence of potential wells beneath selected ones of the barrier layer portions so as to temporarily prevent the electrical signal from being carried along by the surface acoustic wave.

16. The device as defined by claim 12, further comprising means for applying control voltage potentials to said barrier layer portions to control the presence of potential wells beneath selected ones of the barrier layer portions so as to temporarily prevent the electrical signal from being carried along by the surface acoustic wave.

17. The device as defined by claim 13, further comprising means for applying control voltage potentials to said barrier layer portions to control the presence of potential wells beneath selected ones of the barrier layer portions so as to temporarily prevent the electrical signal from being carried along by the surface acoustic wave.

18. The device as defined by claim 14, further comprising means for applying control voltage potentials to said barrier layer portions to control the presence of potential wells beneath selected ones of the barrier layer portions so as to temporarily prevent the electrical signal from being carried along by the surface acoustic wave.

19. The device as defined by claim 11, further comprising a plurality of gate controlled electrodes operative to selectively cause injection of electrical signal to the channel regions beneath selected ones of said barrier layer portions.

20. The device as defined by claim 12, further comprising a plurality of gate controlled electrodes operative to selectively cause injection of electrical signal to the channel regions beneath selected ones of said barrier layer portions.

21. The device as defined by claim 13, further comprising a plurality of gate controlled electrodes operative to selectively cause injection of electrical signal to the channel regions beneath selected ones of said barrier layer portions.

22. The device as defined by claim 15, further comprising a plurality of gate controlled electrodes operative to selectively cause injection of electrical signal to the channel regions beneath selected ones of said barrier layer portions.

23. A semiconductor device, comprising:
a support layer;
a layer of piezoelectric semiconductor material disposed over said support layer;
a conductive barrier layer disposed over a region of said piezoelectric semiconductor material and defining a channel in the piezoelectric semiconductor material beneath the barrier layer, said conductive barrier layer having a plurality of spaced openings therein;
a plurality of taps disposed over said channel in the openings of said barrier layer, said taps comprising metal barrier contacts capacitively coupled to a reference potential;
means for depleting majority carriers from said channel;
transducer means disposed on said piezoelectric semiconductor material for receiving a transducer energizing signal and establishing a surface acoustic wave in said piezoelectric semiconductor material that propagates through the channel;
means, other than said transducer means, for injecting into the channel an electrical charge signal; and
means for sensing delayed versions of the electrical charge signal at said taps.

24. The device as defined by claim 23 wherein said layer of piezoelectric semiconducter material is gallium arsenide.

25. The device as defined by claim 23 wherein said means for injecting said electrical signal into said channel comprises a diode disposed at one end of the channel, and further comprising a control gate disposed between said diode and said barrier layer.

26. A semiconductor device, comprising:
a support layer;
a layer of piezoelectric semiconductor material disposed over said support layer;
a conductive barrier layer disposed over a region of said piezoelectric semiconductor material and defining a channel in the piezoelectric semiconductor material beneath the barrier layer, said conductive barrier layer having a plurality of spaced openings therein;
a plurality of conductive barrier taps disposed over said channel in the openings of said barrier layer;
means for depleting majority carriers from said channel;
transducer means disposed on said piezoelectric semiconductor material for establishing a surface acoustic wave in said piezoelectric semiconductor material that propagates through the channel;
means for injecting an electrical signal into the channel via said taps; and
means for extracting electrical signals from the channel.

27. The device as defined by claim 26, wherein said layer of piezoelectric semiconductor material is gallium arsenide.

28. A semiconductor register device, comprising:
a support layer;
a layer of piezoelectric semiconductor material disposed over said support layer;
a conductive barrier layer disposed over a region of said piezoelectric semiconductor material and defining a channel in the piezoelectric semiconductor material beneath the barrier layer, said barrier layer having a plurality of spaced openings therein such that said barrier layer is divided into barrier layer portions;
means for depleting majority carriers from said channel;
transducer means disposed on said piezoelectric semiconductor material for receiving a transducer energizing signal and establishing a surface acoustic wave in said piezoelectric semiconductor material that propagates through the channel;
means, other than said transducer means, for injecting into the channel electrical charge signals;
means for applying control voltage potentials to said barrier layer portions to control the presence of potential wells beneath alternating ones of the barrier layer portions at selected times so as to temporarily prevent the electrical charge signals from being carried along by the surface acoustic wave; and
means for extracting electrical charge signals from the channel.

29. The device as defined by claim 28 wherein said layer of piezoelectric semiconductor material is N-type gallium arsenide and said support layer is semi-insulating gallium arsenide.

30. A semiconductor device for generating electrical signals dependent upon a pattern of incident light, comprising:
a support layer;
a layer of piezoelectric semiconductor material disposed over said support layer;
a conductive barrier layer disposed over a region of said piezoelectric semiconductor material and defining a channel in the piezoelectric semiconductor material beneath the barrier layer, said conductive barrier layer having a plurality of spaced openings therein so as to divide the barrier layer into a plurality of barrier layer portions;
means for depleting majority carriers from said channel;
transducer means disposed on said piezoelectric semiconductor material for establishing a surface acoustic wave in said piezoelectric semiconductor material that propagates through the channel;
said channel being disposed to receive said incident light pattern such that hole-electron pairs can be generated in said channel as a function of said incident light; and
means for extracting electrical signals from the channel.

31. The device as defined by claim 30 further comprising means for applying control voltage potentials to said barrier layer portions to control the presence of potential wells beneath selected ones of the barrier layer portions so as to temporarily prevent the electrical signals from being carried along by the surface acoustic wave.

32. A method for obtaining an electrical charge signal which has experienced a controlled delay, comprising the steps of:
   forming a buried channel by disposing piezoelectric semiconductor material between confining layer and depleting majority carriers from a channel region in the piezoelectric semiconductor material;
   providing a surface acoustic wave energizing signal to establish a surface acoustic wave in said piezoelectric semiconductor material;
   injecting into the buried channel, from a source other than said surface acoustic wave energizing signal, an input electrical charge signal;
   extracting a delayed version of the input electrical charge signal which has been carried along by the surface acoustic wave.

33. The method as defined by claim 32 further comprising the step of depleting majority carriers from the channel.

34. The method as defined by claim 33 further comprising the step of selectively controlling the potential in different portions of the buried channel to temporarily prevent said electrical charge from being carried along by the surface acoustic wave.

35. A method for obtaining an electrical signal which has experienced a controlled delay, comprising the steps of:
   providing a channel in a piezoelectric semiconductor material;
   providing a surface acoustic wave energizing signal to establish a surface acoustic wave in said piezoelectric semiconductor material that propagates through the channel;
   injecting into the channel, from a source other than said surface acoustic wave energizing signal, an input electrical charge signal; and
   extracting from the channel a delayed version of said input electrical charge signal which has carried along by the surface acoustic wave.

36. The method as defined by claim 35 further comprising the step of depleting majority carriers from the channel.

37. The method as defined by claim 36 further comprising the step of selectively controlling the potential in different portions of the channel to temporarily prevent said electrical charge from being carried along by the surface acoustic wave.

* * * * *